United States Patent
Sakuyama

[11] Patent Number: 6,111,751
[45] Date of Patent: Aug. 29, 2000

[54] CONNECTOR AND CONNECTING STRUCTURE USING CONNECTOR

[75] Inventor: Tomohiro Sakuyama, Tokyo, Japan

[73] Assignee: NEC Corporation, Tokyo, Japan

[21] Appl. No.: 09/314,133

[22] Filed: May 19, 1999

[30] Foreign Application Priority Data

May 19, 1998 [JP] Japan .................................. 10-136341

[51] Int. Cl.$^7$ ...................................................... H05K 7/20
[52] U.S. Cl. ........................ 361/704; 361/700; 361/709; 361/710; 361/717; 361/735; 361/744; 361/761; 361/792; 174/15.2; 174/16.3; 174/252; 165/80.3; 165/185; 165/104.33; 165/104.21; 439/70; 439/485
[58] Field of Search .................................. 361/700, 704, 361/707, 709, 710, 715–722, 735, 744, 761, 763–764, 782–785, 790–792, 752, 728; 174/15.2, 16.3, 252, 52.1; 257/713, 686, 697, 706; 439/70, 485; 165/104.33, 104.21, 104.23, 104.34, 80.3, 80.4, 185

[56] References Cited

U.S. PATENT DOCUMENTS

| | | | |
|---|---|---|---|
| 4,953,060 | 8/1990 | Lauffer et al. | 361/388 |
| 5,015,202 | 5/1991 | Blumentritt et al. | 439/487 |
| 5,099,254 | 3/1992 | Tsukii et al. | 343/853 |
| 5,734,555 | 3/1998 | McMahon | 361/704 |
| 5,808,869 | 9/1998 | Donahoe et al. | 361/704 |
| 5,946,191 | 8/1999 | Oyamada | 361/700 |

FOREIGN PATENT DOCUMENTS 1-101086  7/1989  Japan .
2-288170  11/1990  Japan .

Primary Examiner—Leo P. Picard
Assistant Examiner—Michael Datskovsky
Attorney, Agent, or Firm—Foley & Lardner

[57] ABSTRACT

A connector is provided which can simplify the path for heat radiation between electronic devices, ease restrictions in the structures of the electronic devices and in the arrangement of parts on the printed circuit boards, and reduce work for the highly precise setting of mounting intervals between connecting components. A connecting structure between electronic devices using the above connector is also provided. Heat from electronic parts 71 on a printed circuit board 61 which is provided in an electronic device 11 is conducted to a radiating plate 41. The heat is conducted to a male connecting component 20 by metallic portions 51 which are provided in the back of the male connecting component 20. Then, the heat is conducted from the male connecting component 20 to a female connecting component 30. The heat is conducted from the female connecting component 30 to a radiating plate 42 by metallic portions 52 which are provided in the back of the female connecting component 30, and radiated.

7 Claims, 4 Drawing Sheets

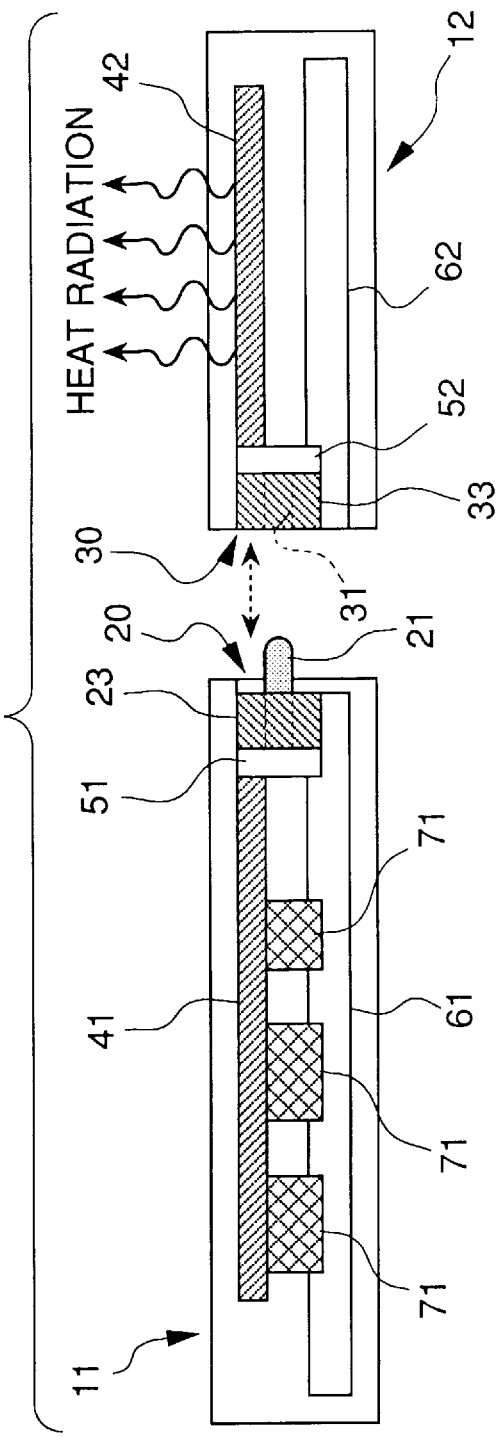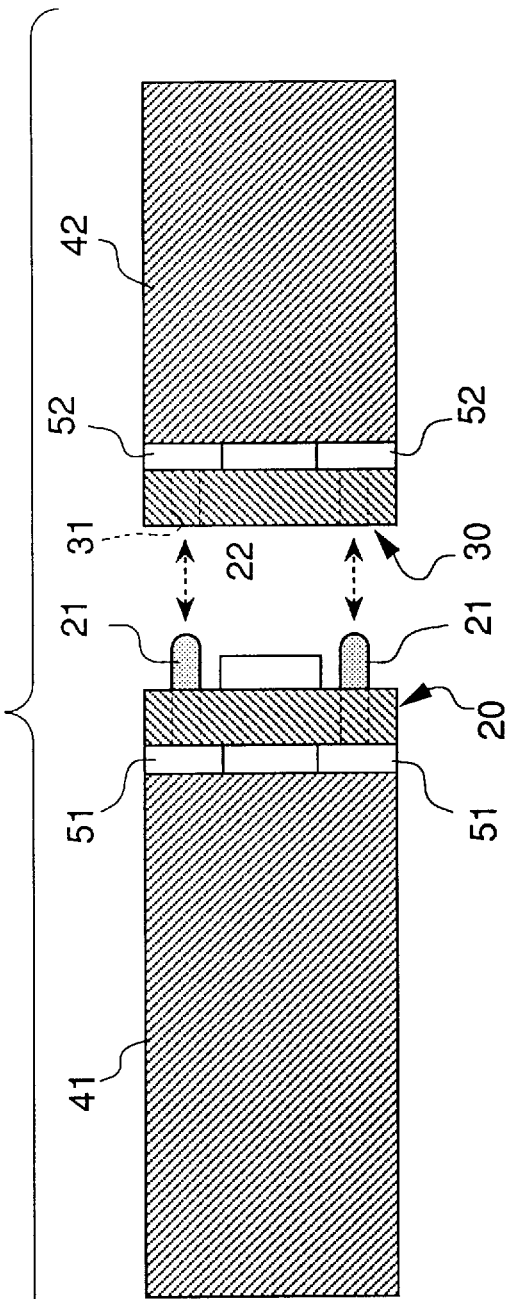

CONNECTOR AND CONNECTING STRUCTURE USING CONNECTOR

BACKGROUND OF THE INVENTION

1. Field of the Invention

The present invention relates to a connector in which a connector for conducting heat (hereinafter referred to as a "thermal connector") and a connector for conducting electrical signals (hereinafter referred to as "electrical connector") are integrated, and to a connecting structure which radiates heat of electronic parts on a printed circuit board.

This application is based on patent application No. Hei 10-136341 filed in Japan, the content of which is incorporated herein by reference.

2. Description of Related Art Including Information Disclosed Under 37 CFR 1.97 and 37 CFR 1.98

Radiation of heat from electrical parts in electrical devices has been hitherto conducted through thermal connectors which are separate from the electrical connectors which provide electrical connections in the electrical devices. Japanese Utility Model Application, Publication (Kokai) No. 1-101086 discloses a technique for connecting two heat pipes using a tubular connector, the thermal resistance of which is reduced so as to improve heat transfer efficiency. This thermal connector only achieves heat transfer, and provides no electrical connection.

However, the above prior art had the following problems.

That is, if the thermal connector disclosed in Japanese Utility Model Application, Publication (Kokai) No. 1-101086 is used for radiating heat generated in an electronic device, a path for heat radiation must be provided in addition to a path for making the electrical connection in the electronic device, which results in a large size and complicated structure for the device.

Moreover, if the path for heat radiation which conducts heat from electronic parts in the electronic device having printed circuit boards is provided between the printed circuit boards, the arrangement of the parts on the printed circuit boards is restricted because of the provision of the path for heat radiation. For example, tall parts cannot be mounted where the path for heat radiation is provided. In addition, the arrangement of electrical connections between parts is similarly restricted.

Furthermore, since engagement between connecting components of the thermal connector and engagement between connecting components of the electrical connector must take place at the same time, the mounting interval between the thermal connector and the electrical connector must be highly precise.

Japanese Patent Application, Publication (Kokai) No. Hei 2-288170 discloses an electric plug connector having a cooled connecting component on an electrical consumer where intense heat is generated. The plug connector includes a movable connecting component having a flexible supply line and both connecting components are configured with heat-contact surfaces which define a low heat resistance when in contact with each other. In the movable connecting component, at least one electrical line part is connected to a part made of a good insulating and heat-conducting material. The flow of heat to the heat-contact surface of the movable connecting component takes place through this part made of insulating and good heat-conducting material.

BRIEF SUMMARY OF THE INVENTION

An object of the present invention is to provide a connector which can simplify the path for heat radiation between a plurality of electronic devices or between a plurality of printed circuit boards, ease restrictions in the structures of the electronic devices and in the arrangement of parts on the printed circuit boards, and reduce work for the highly precise setting of mounting intervals between connecting components. Another object of the present invention is to provide a connecting structure between electronic devices or between printed circuit boards using the above connector.

A connector according to the present invention comprises a terminal for electrical signals and a terminal for heat conduction.

The connector according to the present invention may comprise a first connecting component, which has a protruded first terminal for heat conduction and a terminal for electrical signals, and a second connecting component, which has a hollow second terminal for heat conduction and a terminal for electrical signals which is connectable to the terminal for electrical signals in the first connecting component, wherein the first terminal and the second terminal are engageable with each other.

A connecting structure according to the present invention comprises a first device and a second device, wherein the first device comprises a board on which a first connecting component is mounted which has a terminal for electrical signals and a terminal for heat conduction, electronic parts on the board, and a radiating plate which conducts heat from the electronic parts to the first connecting component, and the second device comprises a board on which a second connecting component connectable to the first connecting component is mounted which has a terminal for electrical signals and a terminal for heat conduction, which are connectable to the terminal for electrical signals and the terminal for heat conduction in the first connecting component, respectively, and a radiating plate which conducts heat transferred from the first connecting component to the second connecting component.

The provision of electrical and thermal paths in a single connector by integrating a thermal connector and an electrical connector according to the present invention produces effects that the path for heat radiation between a plurality of electronic devices is simplified, and restrictions in the structures of the electronic devices and in the arrangement of parts on the printed circuit boards are eased. Similar effects can be obtained where electrical and thermal paths are provided between a plurality of printed circuit boards.

In addition, in contrast to conventional connectors which require the highly precise individual setting of the mounting interval between the thermal connector and the electrical connector, the thermal connector and the electrical connector are integrated in the connector according to the present invention, and therefore work for highly precise setting of mounting intervals between the connecting components can be reduced.

BRIEF DESCRIPTION OF THE SEVERAL VIEWS OF THE DRAWING

FIG. 1A is a longitudinal cross-sectional view showing the connecting structure according to the first embodiment of the present invention.

FIG. 1B is a top plan view of connectors and radiating plates of the present invention, showing the connecting structure according to the first embodiment of the present invention.

DETAILED DESCRIPTION OF THE INVENTION

Figure 2A:
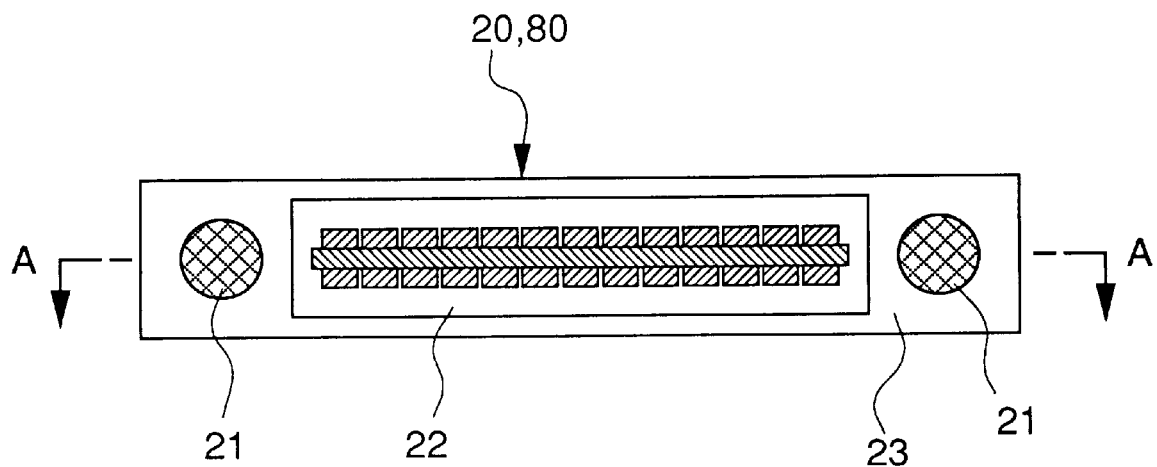
FIG. 2A is an external view of a male connecting component.

A first embodiment of the present invention will be described in detail making reference to the drawings.

FIG. 1A is a longitudinal cross-sectional view of the connecting structure according to this embodiment. FIG. 1B is a top plan view of the connector and the radiating plate, showing the connecting structure according to this embodiment.

In FIGS. 1A and 1B, heat from electronic parts 71 on a printed circuit board 61 which is provided in an electronic device 11 is conducted to a radiating plate 41. The heat is conducted to a male connecting component 20 by metallic portions 51 which are provided in the back of the male connecting component 20. Then, the heat is conducted from the male connecting component 20 to a female connecting component 30 which is mounted on a printed circuit board 62 in an electronic device 12. The heat is conducted from the female connecting component 30 to a radiating plate 42 by metallic portions 52 which are provided in the back of the female connecting component 30, and radiated. The metallic portions 51 are in contact with the radiating plate 41, and the metallic portions 52 are in contact with the radiating plate 42.

Next, the structures of the male connecting component 20 and the female connecting component 30 which are used in this embodiment will be described making reference to FIGS. 1 to 3.

Figure 2B:
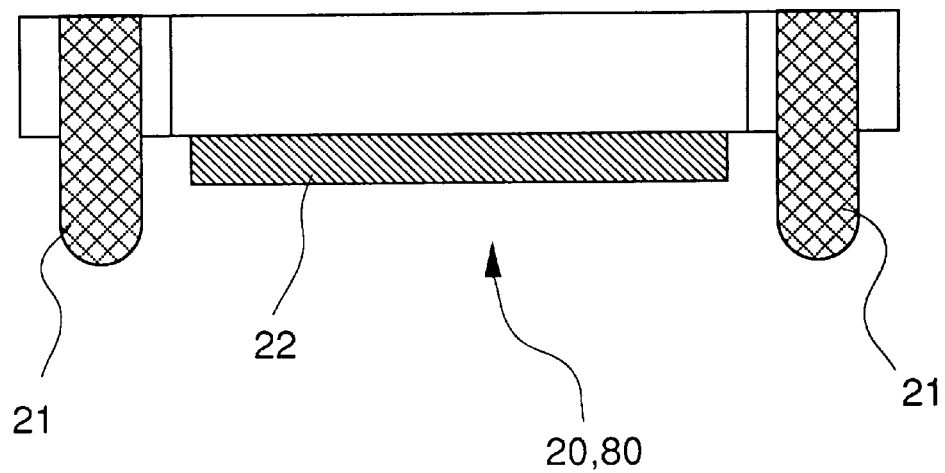
FIG. 2B is a cross-sectional view of a male connecting component.
Figure 3A:
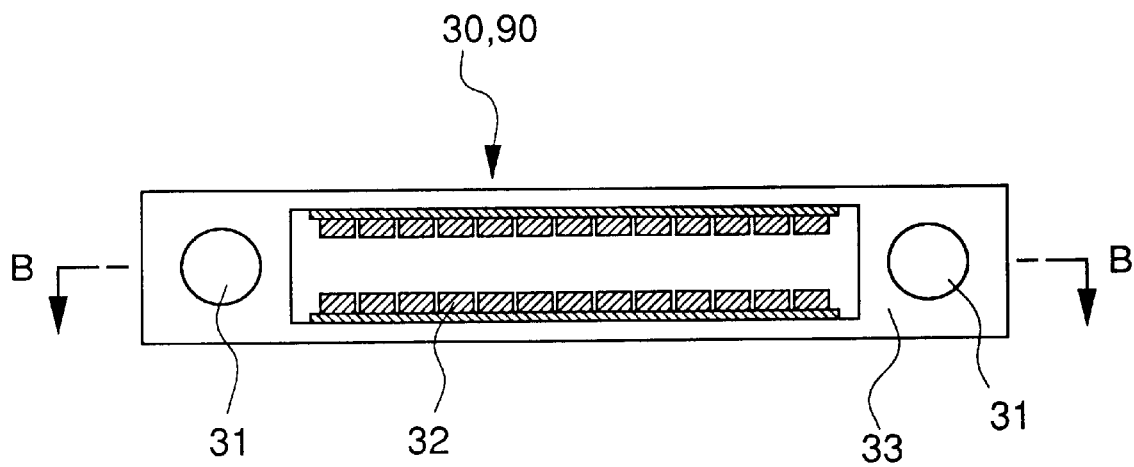
FIG. 3A is an external view of a female connecting component.
Figure 3B:
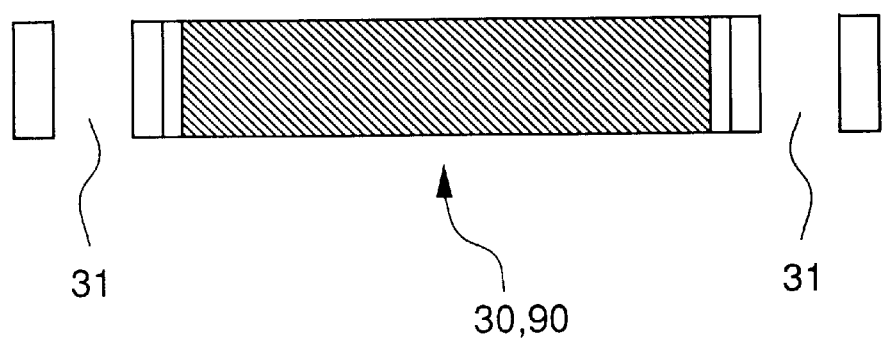
FIG. 3B is a cross-sectional view of a female connecting component.

FIGS. 2A and 3A are external front views of the male connecting component 20 and the female connecting component 30, respectively. FIGS. 2B and 3B are cross-sectional views on planes A—A and B—B, respectively.

In FIGS. 2A and 2B, the male connecting component 20 is in a structure in which an electrically insulating mold resin 23 integrates the (male) terminal for electrical signals 22 and protrusions 21 which extend through the male connecting component 20 and protrude from the front of the male connecting component 20. In FIGS. 3A and 3B, the female connecting component 30 is in a structure in which an electrically insulating mold resin 33 integrates the (female) terminal for electrical signals 32 and holes 31 which extend through the female connecting component 30. The terminal for electrical signals 22 and the terminal for electrical signals 32 conduct electrical signals, which are mounted on the printed circuit boards 61 and 62, respectively, by through-hole mounting or surface mounting.

The male connecting component 20 and the female connecting component 30 are connected when they are used. At this time, the terminal 22 for electrical signals is connected to the terminal 32 for electrical signals. The protrusions 21 engage with the holes 31 to serve as positioners (guides) when the male connecting component 20 and the female connecting component 30 are attached or detached.

The protrusions 21 are in contact with the metallic portion 51 in the back of the male connecting component 20. The tips of the protrusions 21 which protrude from the front of the male connecting component 20 are designed to make contact with the metallic portions 52 which are provided in the back of the female connecting component 30 so that heat conduction from the male connecting component 20 to the female connecting component 30 is made possible.

Metallic portions are not provided at the back end of the terminals for electrical signals. For the metallic portions 51, 52, a good heat conducting metal is used. For each protrusion 21, a good heat conducting material such as a heat pipe is used. These conditions also apply to the other embodiments.

Figure 4A:
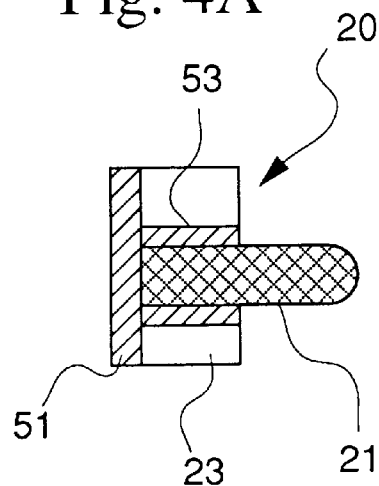
FIG. 4A shows an example of an arrangement of metallic portions in a male connecting component.
Figure 4B:
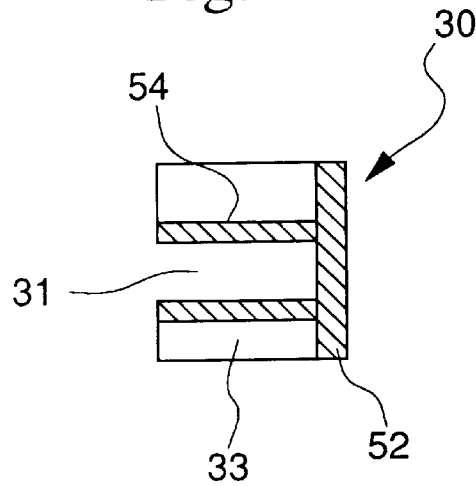
FIG. 4B shows an example of an arrangement of metallic portions in a female connecting component.

Although metallic portions are provided only in the backs of the male and female connecting components, metallic portions may be provided as shown in FIGS. 4A and 4B.

According to FIG. 4A, a metallic portion 53 is provided in addition to the metallic portion 51 so as to surround the protrusion 21 inside the mold resin 23. The metallic portion 51 and the metallic portion 53 are integrated. According to FIG. 4B, a metallic portion 54 is provided in addition to the metallic portion 52 so as to cover the inner surface of the hole 31 of the female connecting component 30. The metallic portion 52 and the metallic portion 54 are integrated. The metallic portion 54 makes contact with the protrusion 21 which engages with the hole 31. The employment of such a construction allows the size of the contact surface between the protrusion 21 and the metallic portions, and therefore can improve the efficiency of heat conduction.

However, the metallic portions are not always necessary; the protrusion 21 may be in direct contact with the radiating plate 41 at the back of the male connecting component 20, and the female connecting component may be constructed so as to allow the protrusion 21 which is put into the hole 31 to make contact with the radiating plate 42.

Next, a second embodiment of the present invention will be described in detail making reference to the drawings.

Figure 5:
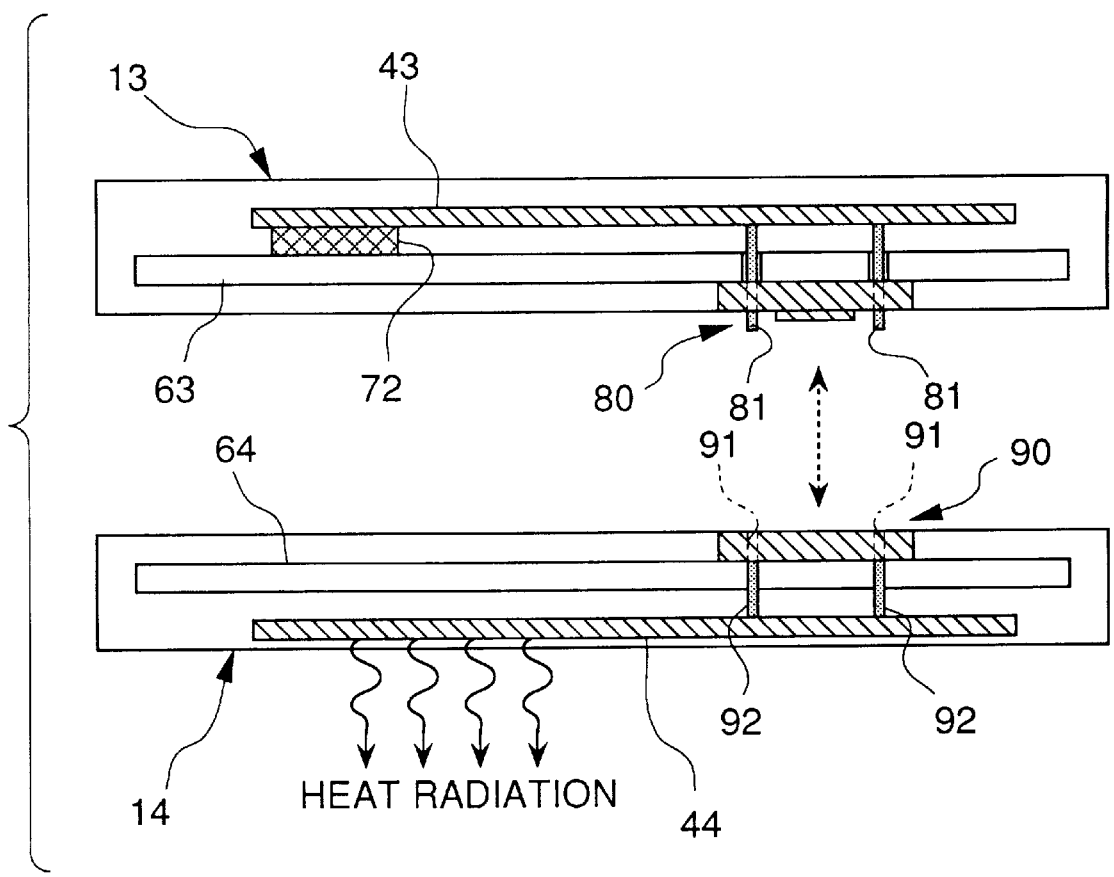
FIG. 5 is a longitudinal cross-sectional view showing the connecting structure according to the second embodiment of the present invention.

FIG. 5 is shows the connecting structure according to this embodiment.

In FIG. 5, heat from electronic parts 72 on a printed circuit board 63 which is provided in an electronic device 13 is conducted to a radiating plate 43. The heat is conducted to a male connecting component 80 by protrusions 81 which extend through the male connecting component 80 from the back thereof. Then, the heat is conducted from the male connecting component 80 to a female connecting component 90 which is provided in an electronic device 14. The heat is conducted from the female connecting component 90 to a radiating plate 44 by protrusions 92 which are provided in the back of the female connecting component 90, and radiated. The back ends of protrusions 81 are in contact with the radiating plate 43, and the protrusions 92 are in contact with the radiating plate 44. Reference numeral 64 indicates a printed circuit board.

Next, the structures of the male connecting component 80 and the female connecting component 90 which are used in this embodiment will be described.

The front views of the male connecting component 80 and the female connecting component 90 of this embodiment are the same as those of the male connecting component 20 and the female connecting component 30 of the first embodiment shown in FIGS. 2A and 3A.

In FIG. 5, the protrusions 81 pass through the male connecting component 80 from the back to the front thereof, and protrude from both the back and the front. The protrusions 92 which are continuous with the holes 91 are provided in the back of the female connecting component 90, protruding therefrom.

The male connecting component 80 and the female connecting component 90 are connected when they are used. The portions of the protrusions 81 which protrude from the front of the male connecting component 80 engage with the holes 91 of the female connecting component 90 to serve as positioners (guides) when the male connecting component 80 and the female connecting component 90 are attached or detached.

The portions of the protrusions 81 which protrude from the back of the male connecting component 80 are in contact with the radiating plate 43. The portions of the protrusions 81 which protrude from the front of the male connecting component 80 make contact with the protrusions 92 of the female connecting component 90 when the protrusions 81 engage with the holes 91. Accordingly, heat of the radiating plate 43 is conducted to the radiating plate 44 by the male and female connecting components, and radiated.

In the above two embodiments, heat was conducted through two electronic devices and radiated. However, even in the case where heat is conducted through three or more electronic devices and radiated, connecting structures similar to those of the above embodiments can be employed. Moreover, where heat is conducted through a plurality of printed circuit boards in a single electronic device and radiated, connecting structures similar to those of the above embodiments can be employed.

What is claimed is:

1. A connector comprising:

a first connecting component, which has a protruded first terminal for heat conduction and a terminal for electrical signals, the first terminal for heat conduction and the terminal for electrical signals in the first connecting component being embedded in an electrically insulated body which forms the first connecting component, and a second connecting component, which has a hollow second terminal for heat conduction and a terminal for electrical signals which is connectable to the terminal for electrical signals in the first connecting component, the second terminal for heat conduction and the terminal for electrical signals in the second connecting component being embedded in an electrically insulated body which forms the second connecting component, wherein the first terminal and the second terminal are engageable with each other.

2. A connector according to claim 1, wherein the first connecting component incorporates a metallic portion in the back thereof, the metallic portion being connected to the first terminal, and the second connecting component incorporates a metallic portion in the back thereof, the metallic portion being connected to the second terminal and making contact with the first terminal.

3. A connector according to claim 2, wherein the metallic portion provided in the back of the first connecting component is in contact with a side of the first terminal inside the first connecting component, and the metallic portion provided in the back of the second connecting component is in contact with an inner surface of the second terminal inside the second connecting component.

4. A connecting structure comprising:

a first device and a second device, wherein the first device comprises a board on which a first connecting component is mounted which has a terminal for electrical signals and a terminal for heat conduction, electronic parts on the board, and a radiating plate which conducts heat from the electronic parts to the first connecting component, the terminal for electrical signals and the terminal for heat conduction in the first connecting component being embedded in an electrically insulated body which forms the first connecting component, and the second device comprises a board on which a second connecting component connectable to the first connecting component is mounted which has a terminal for electrical signals and a terminal for heat conduction, which are connectable to the terminal for electrical signals and the terminal for heat conduction in the first connecting component, respectively, and a radiating plate which radiates heat transferred from the first connecting component to the second connecting component, the terminal for electrical signals and the terminal for heat conduction in the second connecting component being embedded in an electrically insulated body which forms the second connecting component.

5. A connecting structure according to claim 4, wherein the terminal for heat conduction in the first connecting component is protruded, and the terminal for heat conduction in the second connecting component is hollow, so that the terminals for heat conduction are engageable with each other.

6. A connector according to claim 1, wherein the electrically insulated body which forms the first connecting component is an electrically insulating mold resin which integrates the first terminal for heat conduction and the terminal for electrical signals in the first connecting component, and the electrically insulated body which forms the second connecting component is another electrically insulating mold resin which integrates the second terminal for heat conduction and the terminal for electrical signals in the second connecting component.

7. A connecting structure according to claim 4, wherein the electrically insulated body which forms the first connecting component is an electrically insulating mold resin which integrates the first terminal for heat conduction and the terminal for electrical signals in the first connecting component, and the electrically insulated body which forms the second connecting component is another electrically insulating mold resin which integrates the second terminal for heat conduction and the terminal for electrical signals in the second connecting component.

* * * * *